(12) United States Patent
Ge

(10) Patent No.: US 10,852,350 B2
(45) Date of Patent: Dec. 1, 2020

(54) DEFECT MITIGATION IN A CROSSBAR-BASED COMPUTING ENVIRONMENT

(71) Applicant: TETRAMEM INC., Newark, CA (US)

(72) Inventor: Ning Ge, Newark, CA (US)

(*) Notice: Subject to any disclaimer, the term of this patent is extended or adjusted under 35 U.S.C. 154(b) by 0 days.

(21) Appl. No.: 16/138,925

(22) Filed: Sep. 21, 2018

(65) Prior Publication Data

US 2020/0096564 A1 Mar. 26, 2020

(51) Int. Cl.
| | |
|---|---|
| *G01R 31/00* | (2006.01) |
| *G01R 31/317* | (2006.01) |
| *G06F 13/40* | (2006.01) |
| *G11C 5/06* | (2006.01) |
| *G11C 5/02* | (2006.01) |
| *G01R 31/3177* | (2006.01) |

(52) U.S. Cl.
CPC ... *G01R 31/31703* (2013.01); *G01R 31/3177* (2013.01); *G06F 13/4022* (2013.01); *G11C 5/02* (2013.01); *G11C 5/063* (2013.01)

(58) Field of Classification Search
None
See application file for complete search history.

(56) References Cited

U.S. PATENT DOCUMENTS

| | | | | |
|---|---|---|---|---|
| 2002/0122341 A1* | 9/2002 | Perner | ............... | G11C 29/4401 365/200 |
| 2005/0028056 A1* | 2/2005 | Tsao | ................... | G06F 11/1028 714/718 |
| 2007/0229112 A1* | 10/2007 | Mouttet | ............... | H03K 19/177 326/39 |
| 2014/0215121 A1* | 7/2014 | Ordentlich | .......... | G06F 12/0246 711/102 |
| 2015/0170025 A1* | 6/2015 | Wu | ....................... | G06N 3/0445 706/25 |
| 2016/0335535 A1* | 11/2016 | Amir | ........................ | G06N 3/04 |
| 2018/0123595 A1* | 5/2018 | Bai | .................... | H03K 19/1736 |
| 2018/0364785 A1* | 12/2018 | Hu | ........................ | G06F 1/3206 |
| 2019/0325291 A1* | 10/2019 | Gokmen | ............. | G06N 3/0445 |

OTHER PUBLICATIONS

A. Coker, V. Taylor, D. Bhaduri, S. Shukla, A. Raychowdhury and K. Roy, "Multifunction Fault-Tolerance Architecture for Nanoscale Crossbar Memories," in IEEE Transactions on Nanotechnology, vol. 7, No. 2, pp. 202-208, Mar. 2008, doi: 10.1109/TNANO.2007.911319. (Year: 2008).*

* cited by examiner

*Primary Examiner* — Daniel F. McMahon
(74) *Attorney, Agent, or Firm* — Aptum Law; Zheng Andy Liu

(57) ABSTRACT

Systems and methods for mitigating defects in a crossbar-based computing environment are disclosed. In some implementations, an apparatus comprises: a first row wire; a second row wire having a defective device; and a crossbar array configured to receive a first input signal. The defective device is associated with a defect pattern; the first row wire and the second row wire are located within the crossbar array; and the first input signal is configured to be provided to the first row wire. The apparatus further comprises a shuffling module connected to the crossbar array and configured to divert the input signal from the first row wire to the second row wire in accordance with a determination that the defect pattern is within a predefined approximation to a target circuit pattern associated with the first input signal.

10 Claims, 5 Drawing Sheets

DEFECT MITIGATION IN A CROSSBAR-BASED COMPUTING ENVIRONMENT

TECHNICAL FIELD

The present disclosure generally to defect mitigation and more specifically to systems and methods for mitigating defects in a crossbar-based computing environment.

BACKGROUND

A crossbar array may include horizontal metal wire rows and vertical metal wire columns (or other electrodes) intersecting with each other, with cross-point devices formed at the intersecting points. Crossbar arrays may be used in for computing purposes such as in an artificial neural network.

Defects may exist in a crossbar array. For example, a cross-point device may stuck in an un-tunable state (e.g., a short-circuit state, a broken circuit state, or an intermediate state) and become unable to respond to programming signals. Such defects would result in computing inaccuracy since they could not be programmed to the target values. Technical challenges remain therefore to mitigate defects in a crossbar array without degrading computing performance or resulting in prohibitive design or manufacturing cost.

SUMMARY

Systems and methods for mitigating defect in a crossbar-based computing environment are disclosed. In some implementations, an apparatus comprises: a first row wire; a second row wire having a defective device; and a crossbar array configured to receive a first input signal. The defective device is associated with a defect pattern; the first row wire and the second row wire are located within the crossbar array; and the first input signal is configured to be provided to the first row wire. The apparatus further comprises a shuffling module connected to the crossbar array and configured to divert the input signal from the first row wire to the second row wire in accordance with a determination that the defect pattern is within a predefined approximation to a target circuit pattern associated with the first input signal.

The defect pattern, in some implementations, includes an un-tunable conductance and the target circuit pattern includes a target conductance of a device to which the first input signal was configured to be provided to.

The shuffling module is, in some implementations, further configured to divert away from the second row wire in accordance with a second determination that the defect pattern is outside the predefined approximation to a target circuit pattern associated with the first input signal.

The apparatus, in some implementations, includes a plurality of first devices on the first row wire; and a plurality of second devices on the second row wire. At least one device in the plurality of first devices and the plurality of second devices is one of: a memristor, a memristive, a Pulse-Code Modulation (PCM) device, a floating date, a Phase Change Random Access Memory (PCRAM) device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

The shuffling module, in some implementations, includes a crossbar-based switch array.

The apparatus, in some implementations, further includes a digital to analog converter connecting the shuffling module with the crossbar array.

An apparatus, in some implementations, comprises: a crossbar array configured to receive an input signal and produce a raw output signal; a row wire within the crossbar array.

The row wire includes a defective device having a defect pattern and the raw output signal is produced by passing the input signal through the defective device. The apparatus further includes a compensation module configured to: determine an error signal resulted from passing the input signal through the defective device having the defect pattern; and produce a compensated output signal configured to be outputted from the crossbar array in place of the raw output signal in accordance with the error signal.

The defect pattern, in some implementations, includes an un-tunable conductance of the defective device.

The compensation module, in some implementations, is configured to produce the compensated output signal in accordance with the raw output signal and the error signal.

A method comprises: identifying a defect pattern of an apparatus; the apparatus includes: a first row wire; a second row wire; a first crossbar array receiving an input signal, wherein the first row wire and the second row wire are in the first crossbar array; a plurality of first devices on the first row wire; a plurality of second devices on the second row wire, wherein the plurality of first devices and the plurality of second devices include a defective device; checking a row with defects; comparing to each row, or a set of rows in a target conductance matrix; identifying a best-fitting row in the target conductance matrix with the target conductance most close to the defects' conductance; remembering an index of the best-fitting row; programming the best-fitting row; and shuffling the input signal to the best-fitting row.

A method comprises: identifying a defect pattern of an apparatus, wherein the apparatus includes: a first row wire; a second row wire; a first crossbar array receiving an input signal and transmitting a raw output signal, wherein the first row wire and the second row wire are in the first crossbar array; a plurality of first devices on the first row wire; a plurality of second devices on the second row wire, wherein the plurality of first devices and the plurality of second devices include a defective device; reading the raw output signal; estimating an error current in accordance with the defect pattern and the input signal; deducting a contribution of the error current from the raw output signal; and producing a final output signal.

A method comprises: identifying a defect pattern of an apparatus, wherein the apparatus includes: a first row wire; a second row wire; a first crossbar array receiving an input signal, wherein the first row wire and the second row wire are in the first crossbar array; a plurality of first devices on the first row wire; a plurality of second devices on the second row wire, wherein the plurality of first devices and the plurality of second devices include a defective device; checking a row with defects; using conversion algorithm to find a new mapping conductance; updating entries in the new mapping conductance with a conductance of the defective device; comparing to each row, or a set of rows in a target conductance matrix with the new mapping conductance; finding a best-fitting row in the target conductance matrix with a target conductance most close to the conductance of the defective device; remembering an index of the best-fitting row; programming the best-fitting row; and shuffling the input signal to the best-fitting row.

In some implementations, the method further comprises: checking whether all defected rows have been checked; if yes, then programming the remaining rows; using the apparatus for computing; producing a raw output signal; estimating an error current with the target conductance; deducting a contribution of the error current from the raw output signal; and producing a final output signal; if no, then repeating the step of comparing to each row, or a set of rows in a target conductance matrix with the new mapping conductance.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Systems and methods for mitigating defects in a crossbar are provided. The technologies described in the present disclosure may provide the following technical advantages. First, defects within a crossbar may cause a crossbar array to become and stay unresponsive or un-programmable, since the conductance of the defects are fixed (e.g., un-tunable or un-changeable). Using redundant circuits to replace defective rows or columns may reduce the impact of a defect; but, the cost of providing redundancy becomes prohibitive in large-scale crossbar arrays. Because, an entire row or column would have to be replaced, even if there is only a single defect in the row or column. The systems and methods described in the present disclosure can mitigate defects in a crossbar array at a much lower cost.

Second, where one or more crossbar arrays are used to implement an artificial neural network, re-training a neural network model may mitigate defects in the crossbar arrays. This assumes that the neural network model has resilience to the defects. But, because each chip may have its own defect patterns, it may therefore be necessary to re-train every chip to overcome all the defect patterns, rending this solution almost impractical. It is preferred that a neural network model be trained once and reused for making inference as many times as possible.

Moreover, re-training may only be applied in certain implementations, for example, where a threshold amount of data is present. Retraining may also be inapplicable to general matrix-vector multiplications. The technologies described in the present disclosure can mitigate defects without these drawbacks.

Third, the technologies disclosed can determine the effect of parasitic elements present in a crossbar array and mitigate defects more accurately.

Figure 1:
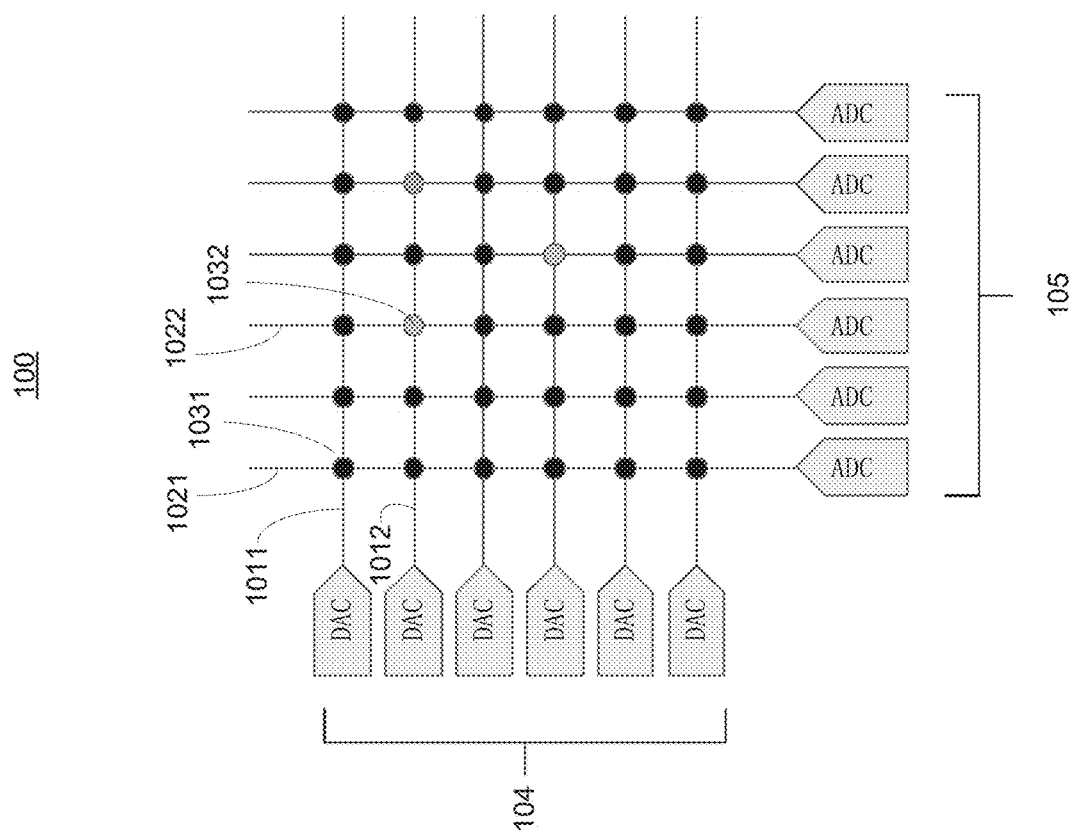
FIG. 1 is a block diagram illustrating an example crossbar array circuit with defects in accordance with some implementations.

FIG. 1 shows a block diagram illustrating an example crossbar array circuit 100, in which one or more defects are present. As shown in FIG. 1, the crossbar array circuit 100 includes a first row wire 1011, a second row wire 1012, a first column wire 1021, a second column wire 1022, a first cross-point device 1031 connecting the first row wire 1011 and the first column wire 1021, and a second cross-point device 1031 connecting the second row wire 1012 and the second column wire 1022. In some embodiments, the first cross-point device 1031 is an operational cross-point device and the second cross-point device 1032 is a defective cross-point device.

In some implementations, the cross-point device may be of a 1-Transistor-1-Resistor (1T1R) structure, a 1-Selector-1-Resistor (1S1R) structure, or a 2-Resistor (2R) structure. The cross-point device may be one of: a memristor, a memristive device, a Pulse-Code Modulation (PCM) device, a floating date, a Phase Change Random Access Memory (PCRAM) device, a Resistive Random-Access Memory (RRAIVI or ReRAIVI), a Magnetoresistive Random-Access Memory (MRAM), a Dynamic random-access memory (DRAM), a Static Random-Access Memory (static RAM or SRAM), or other devices with tunable resistance.

The conductance of an operational cross-point device may, in some implementations, be tuned by applying a high enough voltage or current signal across the cross-point device. In some implementations, the row wires, column wires, or both, are metal wires.

An input signal (which may also be referred to as a programming signal) reaches the first row wire 1011 and the second row wire 1012, after entering from the crossbar array circuit 100 through the first converter array 104 (e.g., a Digital to Analog Converter (DAC) array). The current may then flow through the first operational cross-point device 1031 and the second defective cross-point device 1032. After leaving the second converter array 105 (e.g., an Analog to Digital Converter (ADC) array), the current is outputted.

In some implementations, a defect (e.g., a defective cross-point device) in a crossbar array is a cross-point device having a conductance that could not be tuned. The conductance of an operational cross-point device may be arbitrarily tuned between a Low Resistance State (LRS) and a High Resistance State (HRS); the conductance of a defective cross-point device, in contrast, may be stuck at a certain conductance level, which may be either inside or outside the operational range, and could not be tuned by programming signals.

Defects in crossbar arrays may degrade computing accuracy. In an ideal N×N crossbar array, the current collected at the output of the j-th column can be determined as follows:

$$I_{j,ideal} = \Sigma_{i=1}^{N} G_{i,j} \cdot V_i \qquad \text{(equation 1)},$$

where $G_{i,j}$ represents the ideal device's conductance at the i-th row and j-th column, $V_i$ represents the input voltage signal at the i-th row.

When there are m (m<<i) defects in the column with location index as [k1, k2, k3, . . . , km], error present in the output current may be determined as follows:

$$I_{j,error} = I_{j,ideal} - I_{j,defect} = \Sigma_{i=[k1,k2,k3,\ldots,km]}(G_{i,j} - G_{i,j}^{defect}) \cdot V_i \qquad \text{(equation 2)},$$

where $G_{i,j}^{defect}$ represents the defect's conductance at the i-th row and j-th column.

In crossbar arrays, error in an output current caused by defects is strongly coupled with such circuit parasitic as wire resistance, device nonlinearity, and thermal variations. Thus, $I_{j,error}$ cannot be easily removed by naive input or output compensation.

The present disclosure provides at least three ways to mitigate defects. These methods may mitigate defect at different stages of a crossbar-based computing process and may thus be used individually or in combination with each other, to optimize performance and cost.

Input Signal Shuffling in Accordance with Defects Detected

Defect has a negative impact when the conductance at which a device becomes un-tunable differs from a target conductance or resistance. For instance, a cross-point device, when operational, may have a target resistance ranging from 2K Ω to 2M Ω. On the other hand, when the cross-point device becomes defective and has a non-tunable resistance of 500K Ω, the cross-point device cannot be tuned to provide a 10K Ω resistance, regardless how much voltage or current is applied.

This defect may not be noticeable or may not have a significant negative impact, however, if a target resistance (e.g., 510K Ω) is within a proximity to the non-tunable resistance (500K Ω). Accordingly, using a defective device's non-tunable conductance to simulate a target conductance would render the defective insignificant, thereby mitigating or eliminating the defect.

Figure 2:
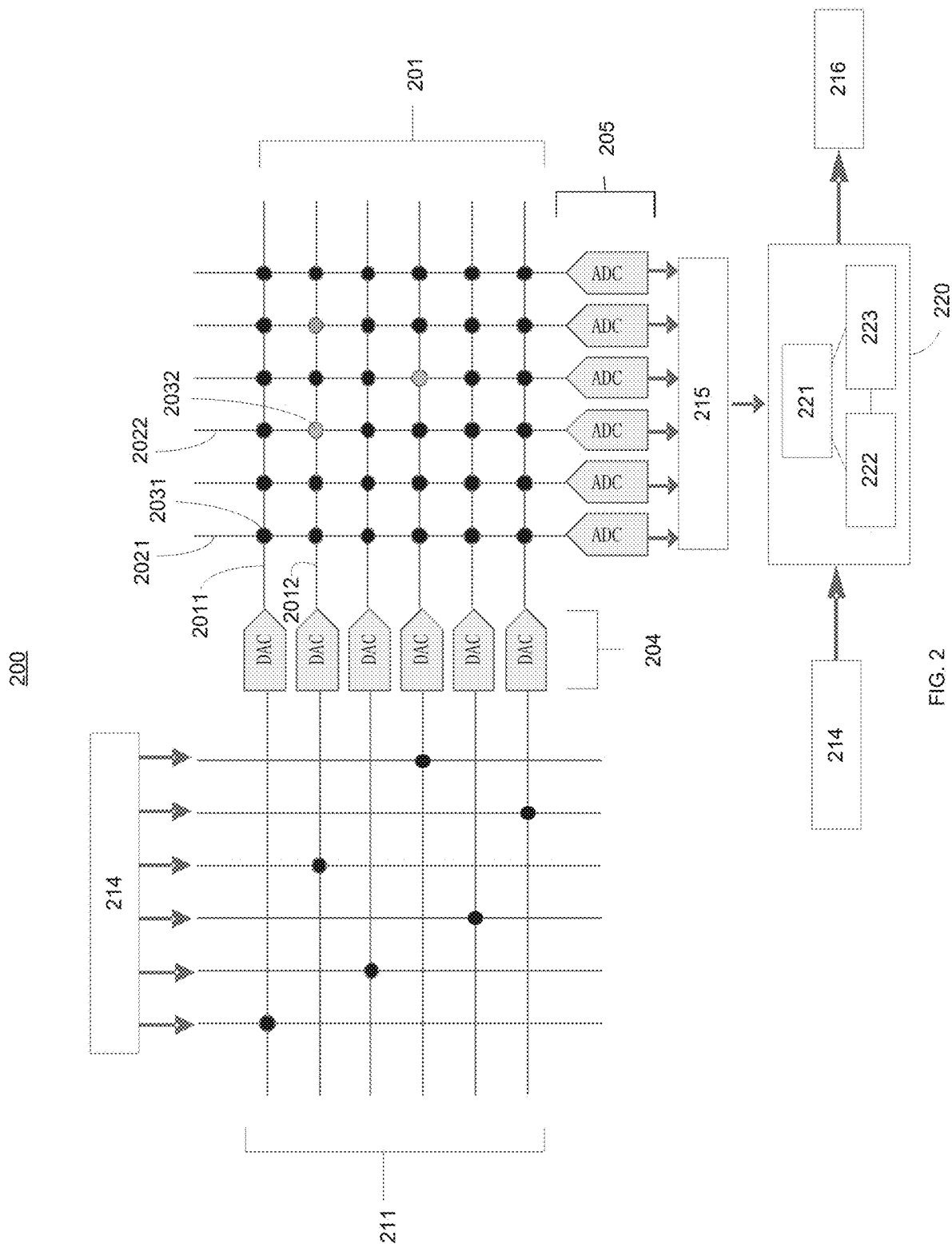
FIG. 2 is a block diagram illustrating an example crossbar array circuit with defects in accordance with some implementations.

A shuffling module may enable such as a simulation. As shown in FIG. 2, the crossbar array circuit 200 includes a crossbar array 201, a first converter 204, a second converter 205, and a shuffling module 211. In some implementations, the crossbar array 201, which receive input signals, includes a first row wire 2011 and a second row wire 2012. The shuffling module 211 may shuffle the input signals between the first row wire 2011 and the second row wire 2012. For example, the shuffling module 211 may divert input signals that are intended to be provided to the first row wire 2011, to the second row wire 2012, and vice versa. For another example, input signals intended for an operational cross-point device having a 510K Ω resistance may be switched to a defective cross-point device having an un-tunable 500K Ω resistance. In these ways, the impact of defects present in a crossbar array is mitigated, because the conductance of a defective device is used to simulate a target conductance intended to be provided by an operational device. In some implementations, the shuffling module 211 may include a crossbar-based switch array.

Figure 3:
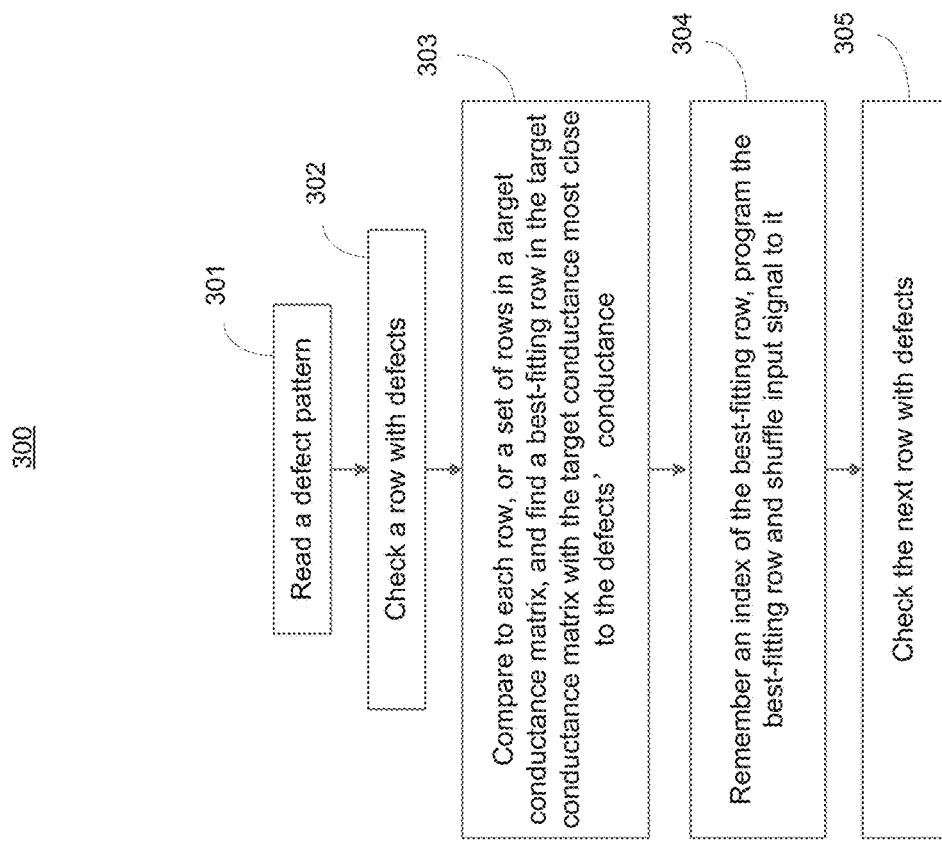
FIG. 3 is a flowchart illustrating an example method to for mitigating defect in a crossbar-based computing environment in accordance with some implementations.

FIG. 3 is a flowchart illustrating an example method 300 to for mitigating defect in a crossbar-based computing environment in accordance with some implementations.

As shown in FIG. 3, the method 300 includes identifying the defect pattern of the crossbar array 201 (step 301) and then checking a row wire with defects, such as the second row wire 2012, in which the defective cross-point device 2032 in located (step 302).

In some implementations, identifying a defect pattern may include determining which cross-point devices within a crossbar array are defective and the locations of these defective devices within the crossbar array. A defect pattern may be identified by applying a current or voltage to the crossbar array 201 and recording the performance of each cross-point device, including the defective cross-point device 2032. In some implementations, the defect pattern of the crossbar array may be stored in a memory or any data storage device for future reference.

Next, the row with defective device is compared to all or a subset of rows in a target conductance matrix to identify a best-fitting row, such as the first row wire 2011 (which contains no defect in the row), from the target conductance matrix. The best-fitting row may be a row having target conductance that is closest to the defects' conductance (step 303). The best-fitting row may be a row having target conductance that within a predefined approximation to the defects' conductance. For example, if a defect's conductance of 5500Ω, the best-fitting row within a target conductance matrix may be the row that has a target conductance of (e.g., 5K Ω), when the predefined approximation is ±500Ω.

In some implementations, a calculator (for example, an adder, a subtractor, a voltage amplifier, or a differential amplifier, or a Central Processing Unit (CPU)) is used to identify the best-fitting row within a target conductance matrix. In some implementations, a subtractor is used to calculate the minimum absolute value of the conductance of a defective row (a row in which a defect is located) subtracting the conductance of the best-fitting row.

The index (or any other identifier) of the best-fitting row, such as a row number 1, is provided to a shuffling module. The method 300 further includes mapping the second row wire 2012 with defects to the best-fitting row in the target conductance matrix, and shuffling the input signals, which were to be provided to the best-fitting row, now to the defective row (step 304). The method 300 continues by checking the next row with defects (step 305) and repeating the steps 302 to 304. The input signal shuffling may be implemented with a shuffling crossbar array 211.

Output Signal Compensation in Accordance with Defects Detected

Sometimes, it may not be feasible to identify a perfect row (e.g., the best-fitting row) to which the input signal may be mapped or shuffled. When there are multiple defects in the same row, conflicts may also arise. Compensating output signals may therefore be used, in alternative to or in conjunction with, shuffling input signals, in order to mitigate defects.

Figure 4:
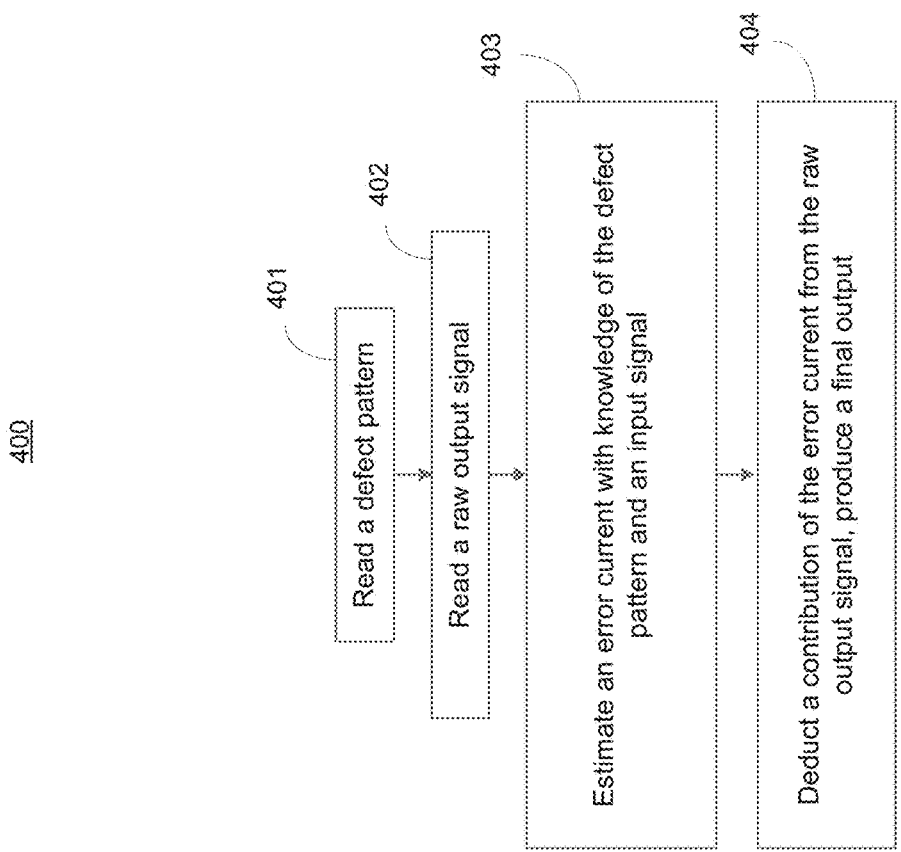
FIG. 4 is a flowchart illustrating an example method for mitigating defect in a crossbar-based computing environment in accordance with some implementations.

FIG. 4 is a flowchart illustrating an example method 400 for mitigating defect in a crossbar-based computing environment in accordance with some implementations.

As shown in FIG. 4, the method 400 includes identifying a defect pattern of the crossbar array 201 (step 401) and then reading a raw output signal 215 (step 402). Next, an error current or voltage is estimated in accordance with the defect pattern and the input signal 214 (step 403).

The contribution of the error current or voltage is then deducted from the raw output signal 215 to produce a final output signal 216.

In some implementations, as shown in FIG. 2, the estimation is done by a compensation module 220, which includes a buffer 221, a CPU 222, and a compensation circuit 223. The defect's impact may thus be mitigated using the compensation module 220 at the output stage. For example, after the raw output signal 215 is detected and saved in the buffer 221, the error current is calculated in accordance with the defect pattern and input signals using equation (2) and its contribution deducted from the raw output signal 215. The result of the deduction may be implemented at the compensation circuit 223 and to produce the final output signal 216. For instance, a target conductance of the second row wire 2012 is 50K Ω. However, after the raw output signal 215 is sensed, the conductance of a selected row wire (e.g., the second row wire 2012) is calculated as 10K Ω. The conductance information may be in the buffer 221. The CPU 222 then compares two different conductance values and determines that the error current is, for example, 0.001 mA. The CPU 222 may then determine a compensation current or voltage; the compensation circuit 223 may then apply the compensation current or voltage to the output signal.

In some implementations, the CPU 222 may include one or more processors; the buffer 221 includes a transitory or non-transitory memory; and the compensation circuit 223 includes a crossbar array.

Matrix Mapping in Accordance with Defects Detected

Input signal shuffling and output signal compensation assume ideal crossbar behaviors, which may not hold true when a crossbar array scales up. Also, when a defect is stuck in a highly conductive state (e.g., a short-circuited state), the defect's conductance may be differ significantly from a target conductance. Due to a defect's high conductance, the error current may be significant, which amplifies the impact of circuit parasitic, making the estimation even more inaccurate. Matrix mapping may be used to handle circuit parasitic present in a crossbar array. It should be noted that input signal shuffling, output signal compensation, and matrix mapping may be applied separately or in combination with each other. Cost and performance requirement may be considered to determine whether to these technologies in combination or individually.

Figure 5:
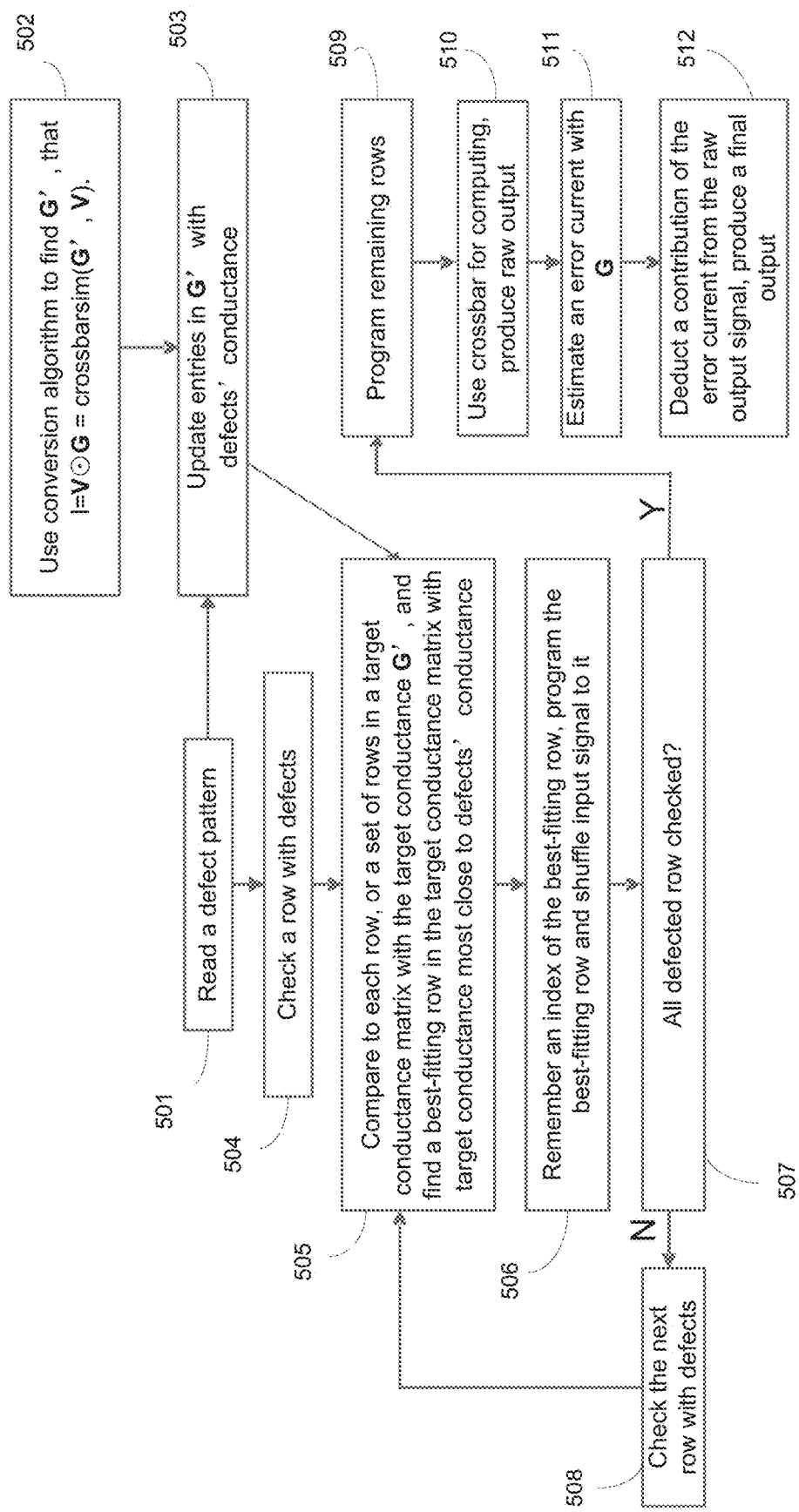
FIG. 5 is a flowchart illustrating an example method for mitigating defect in a crossbar-based computing environment in accordance with some implementations.

FIG. 5 is a flowchart illustrating an example method 500 for mitigating defect in a crossbar-based computing environment in accordance with some implementations.

As shown in FIG. 5, the method 500 may include steps described with reference to methods 300 and 400. The method 500 includes identifying a defect pattern (step 501). Applying a conversion algorithm to identify a new mapping conductance G' through circuit simulation, where current at each cross-point device may be calculated using an actual crossbar model as follows:

$$I\_actual = V \odot G = \text{crossbarsim}(G', V) \quad \text{(step 502)}.$$

The I_actual equals to the ideal current passing through each cross-point device with an original target conductance G. The target conductance is replaced with the conductance of a defect in G, a crossbar array that behaves similarly to an ideal crossbar circuit with defective cross-point devices. The method 500 then includes updating entries in the new mapping conductance G' with defects' conductance (step 503).

Next, after the matrix mapping is completed, one or more rows with at least one defect are identified (step 504). Rows with defects (or defective rows) are then compared to each row (or a set of rows) in a target conductance matrix, which includes the new target conductance which is the new mapping conductance G', and The method 500 attempts to locate, within the target conductance matrix, a best-fitting row having a target conductance that matches or is within a predefined approximation to the conductance of a defective device (step 505).

The method 500 also includes storing the identifier (e.g., the row index) of the best-fitting row, programming the best-fitting row, and shuffling one or more input signals to the best-fitting row (step 506). Next, the method 500 also includes determining whether all defective rows have been reviewed (step 507). If all defective rows have not been reviewed for the purpose of mitigating defects, then step 505 may be repeated.

If, alternatively, all defective rows have been reviewed for the purpose of mitigating defects, then the method 500 proceeds to programming the remaining rows (step 509), using the crossbar array 201 for computing purposes, and producing the raw output signal 215 (step 510).

The method 500 may apply the output signal compensation technique by estimating an error current or voltage with the original target conductance G (step 511), adjusting (e.g., deducting or increasing) the contribution of the error current or voltage from the raw output signal 215, and producing a compensated output signal 216 (step 512).

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a first row wire;
a second row wire having a defective device, wherein the defective device is associated with a defect pattern, wherein the defect pattern includes an un-tunable conductance and the target circuit pattern includes a target conductance of a device to which a first input signal was configured to be provided to;
a crossbar array configured to receive the first input signal, wherein
the first row wire and the second row wire are located within the crossbar array; and
the first input signal is configured to be provided to the first row wire;
a shuffling module connected to the crossbar array and configured to divert the input signal from the first row wire to the second row wire in accordance with a determination that the defect pattern is within a user-defined approximation to a target circuit pattern associated with the first input signal.

2. The apparatus as claimed in claim 1, wherein the shuffling module is further configured to divert away from the second row wire in accordance with a second determination that the defect pattern is outside the predefined approximation to a target circuit pattern associated with the first input signal.

3. The apparatus as claimed in claim 1, further comprising:
a plurality of first devices on the first row wire; a plurality of second devices on the second row wire; wherein at least one device in the plurality of first devices and the plurality of second devices is one of: a memristor, a memristive, a Pulse-Code Modulation (PCM) device, a floating date, a Phase Change Random Access Memory (PCRAM) device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

4. The apparatus as claimed in claim 1, wherein the shuffling module includes a crossbar based switch array.

5. The apparatus as claimed in claim 1, further comprises:
a digital to analog converter connecting the shuffling module with the crossbar array.

6. An apparatus comprising:
a crossbar array configured to receive an input signal and produce a raw output signal, a row wire within the crossbar array, wherein the row wire includes a defective device having a defect pattern, wherein the defect pattern includes an un-tunable conductance of the defective device, wherein the raw output signal is produced by passing the input signal through the defective device;
a compensation module configured to:
determine an error signal resulted from passing the input signal through the defective device; and
produce a compensated output signal configured to be outputted from the crossbar array in place of the raw output signal in accordance with the error signal.

7. The apparatus as claimed in claim 6, wherein the compensation module is configured to produce the compensated output signal in accordance with the raw output signal and the error signal.

8. A method comprising:
identifying a defect pattern of an apparatus, wherein the apparatus includes:
a first row wire;
a second row wire;
a first crossbar array receiving an input signal, wherein the first row wire and the second row wire are in the first crossbar array;
a plurality of first devices on the first row wire; and
a plurality of second devices on the second row wire, wherein the plurality of first
devices and the plurality of second devices include a defective device;
detecting one or more rows, each of which has at least one defect; comparing the one or more rows to a set of rows in a target conductance matrix; identifying a best-fitting row in the target conductance matrix with the target conductance that is within a user-defined approximation to conductance of a defect; programming the best-fitting row;
and shuffling the input signal to the best-fitting row; and
in accordance with a first determination that all defective rows have been examined:
programming remaining rows that are without defect; determining an error current with the target conductance; and
deducting a contribution of the error current from the raw output signal to produce a compensated output signal, in accordance with a second determination that all defective rows have not been examined repeating step of the comparing, the identifying, the programming and the shuffling.

9. The apparatus of claim 1, wherein the user-defined approximation is a 10% deviation between the defect pattern and the target circuit pattern associated with the first input signal.

10. The method of claim 8, wherein the user-defined approximation is a 10% deviation between the defect pattern and the target circuit pattern associated with the first input signal.

* * * * *